(12) United States Patent     (10) Patent No.:   US 12,625,265 B2

Al Abbas et al.     (45) Date of Patent:    May 12, 2026

(54) ADDRESSING REDUNDANT MEMORY FOR LIDAR PIXELS

(71) Applicant: Ouster, Inc., San Francisco, CA (US)

(72) Inventors: Tarek Al Abbas, Edinburgh (GB); David Storrar, Falkirk (GB); Colin Steele, Edinburgh (GB); Stephen Kwiatkowski, Edinburgh (GB)

(73) Assignee: Ouster, Inc., San Francisco, CA (US)

( * ) Notice: Subject to any disclaimer, the term of this patent is extended or adjusted under 35 U.S.C. 154(b) by 799 days.

(21) Appl. No.: 18/150,440

(22) Filed: Jan. 5, 2023

(65) Prior Publication Data

US 2023/0221439 A1     Jul. 13, 2023

Related U.S. Application Data

(60) Provisional application No. 63/297,622, filed on Jan. 7, 2022.

(51) Int. Cl.
| | |
|---|---|
| *G01S 17/42* | (2006.01) |
| *G01J 1/44* | (2006.01) |
| *G01S 7/484* | (2006.01) |
| *G01S 7/4861* | (2020.01) |
| *G01S 7/487* | (2006.01) |
| *H10B 10/00* | (2023.01) |

(52) U.S. Cl.
CPC ................. *G01S 17/42* (2013.01); *G01J 1/44* (2013.01); *G01S 7/484* (2013.01); *G01S 7/4861* (2013.01); *G01S 7/4876* (2013.01); *H10B 10/00* (2023.02); *G01J 2001/446* (2013.01); *G01J 2001/4466* (2013.01)

(58) Field of Classification Search
CPC ..... G01S 17/42; G01J 2001/4466; G01J 1/44; H10B 10/00
USPC ........................................ 356/5.01
See application file for complete search history.

(56) References Cited

U.S. PATENT DOCUMENTS

| | | | | |
|---|---|---|---|---|
| 5,005,158 A | * | 4/1991 | McClure | .................. G11C 8/04 365/240 |
| 2022/0099814 A1 | * | 3/2022 | Finkelstein | ............. G01S 7/486 |

\* cited by examiner

*Primary Examiner* — Jeffery A Williams

(74) *Attorney, Agent, or Firm* — Kilpatrick Townsend & Stockton LLP

(57) ABSTRACT

Techniques described herein provide memory redundancy. For example, the memory block for each pixel can be partitioned into multiple memory bins, and the number of memory bins can be larger than the number of time bins. Once a faulty memory cell is identified, an address associated with the memory bin that has the faulty memory cell can be skipped by an address generator. As such, the faulty memory cell is not used to store time-of-fight (ToF) information.

20 Claims, 12 Drawing Sheets

200

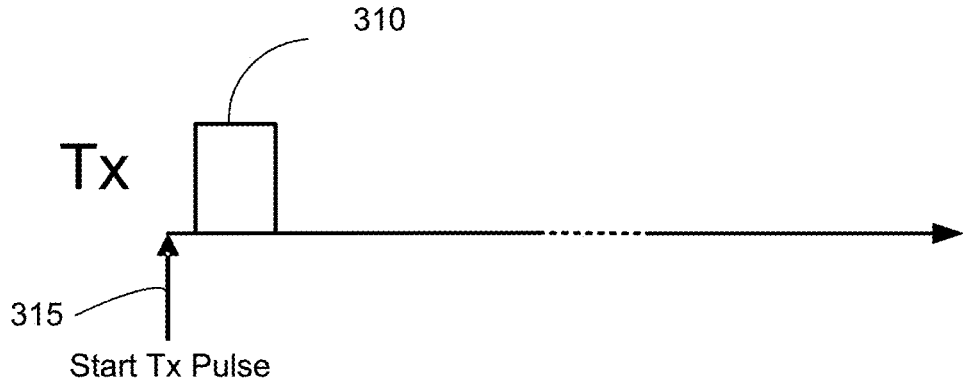
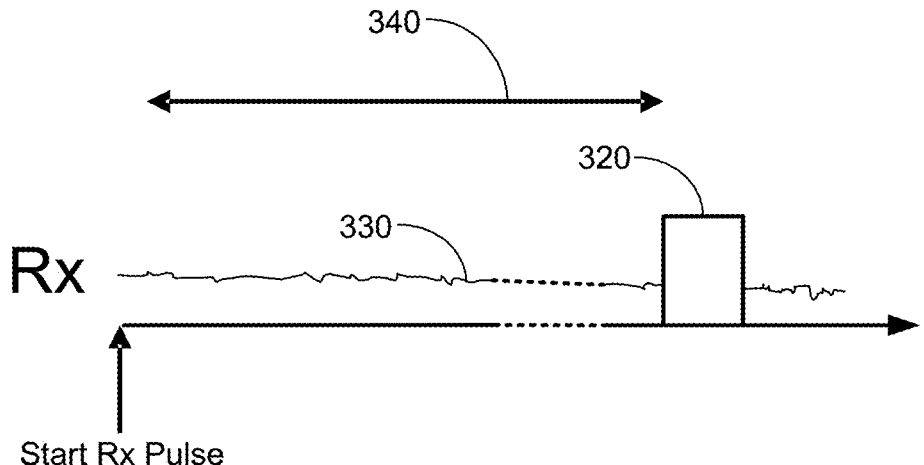
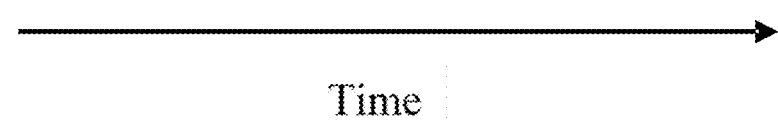
Time
FIG. 3

600

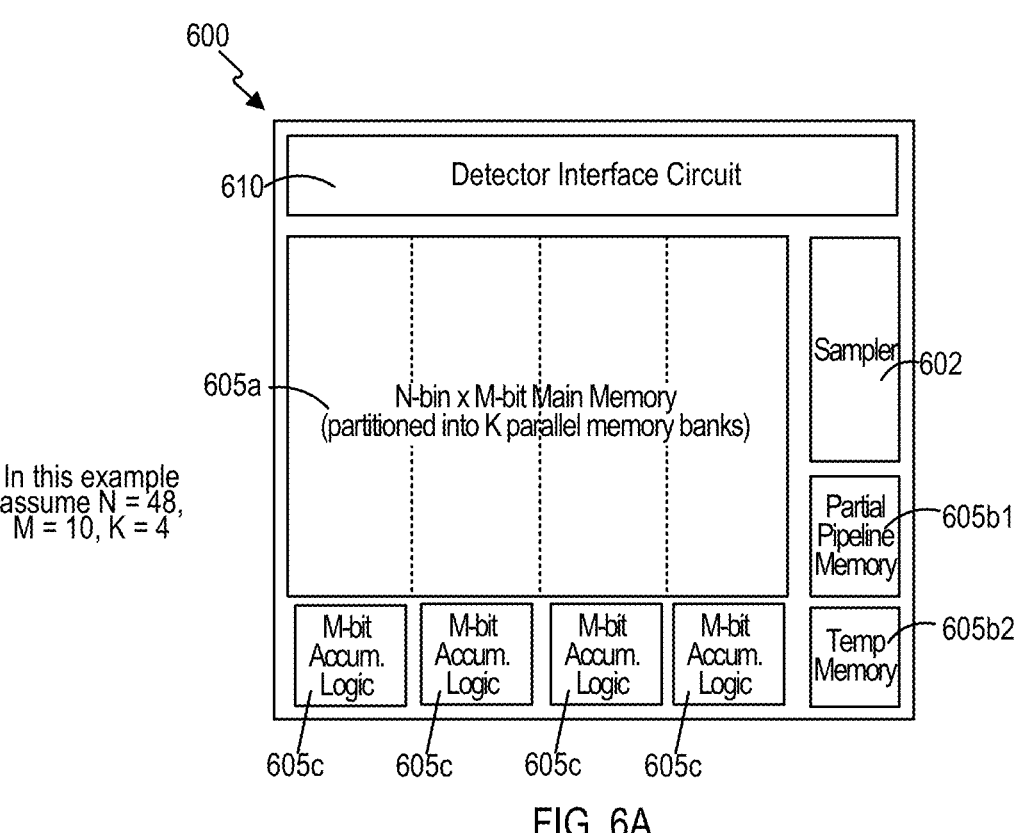

610 — Detector Interface Circuit

In this example
assume N = 48,
M = 10, K = 4

605a — N-bin x M-bit Main Memory
(partitioned into K parallel memory banks)

Sampler — 602

Partial Pipeline Memory — 605b1

Temp Memory — 605b2

M-bit Accum. Logic

M-bit Accum. Logic

M-bit Accum. Logic

M-bit Accum. Logic 605c          605c          605c          605c

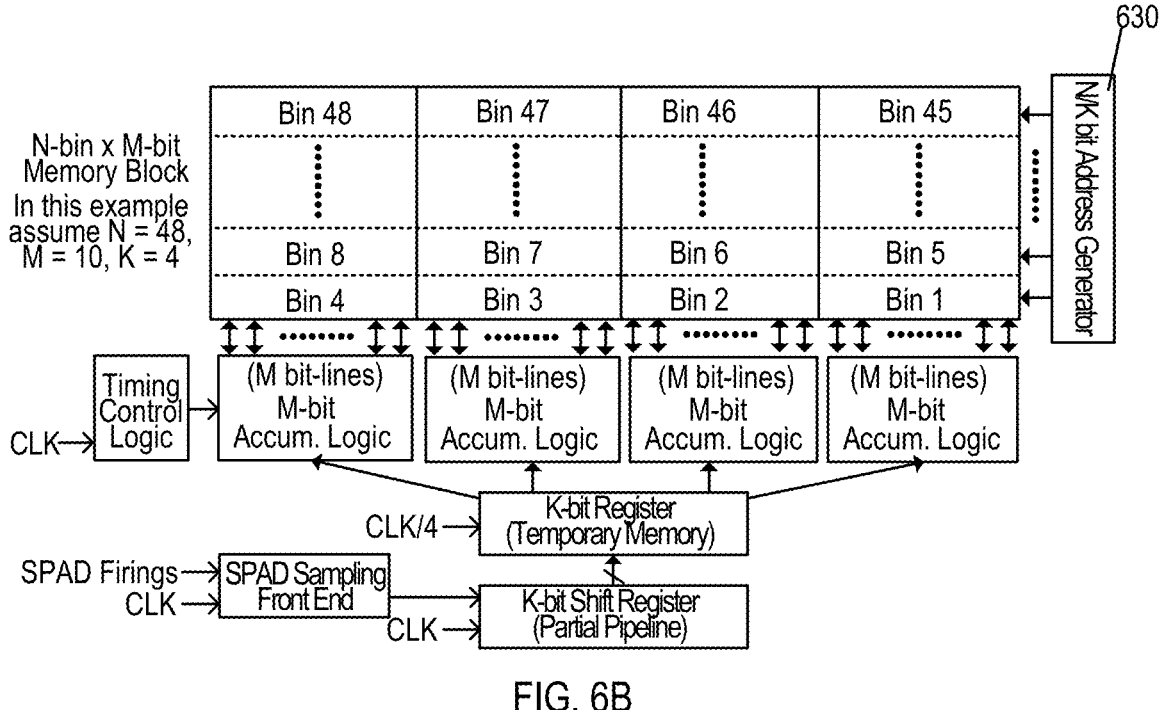

N-bin x M-bit
Memory Block
In this example
assume N = 48,
M = 10, K = 4

Bin 48          Bin 47          Bin 46          Bin 45

Bin 8          Bin 7          Bin 6          Bin 5
Bin 4          Bin 3          Bin 2          Bin 1

N/K bit Address Generator

CLK→  Timing Control Logic (M bit-lines) M-bit Accum. Logic (M bit-lines) M-bit Accum. Logic (M bit-lines) M-bit Accum. Logic (M bit-lines) M-bit Accum. Logic CLK/4→  K-bit Register (Temporary Memory)

SPAD Firings→  SPAD Sampling Front End
CLK→

CLK→  K-bit Shift Register (Partial Pipeline)

FIG. 6B

Without skip logic

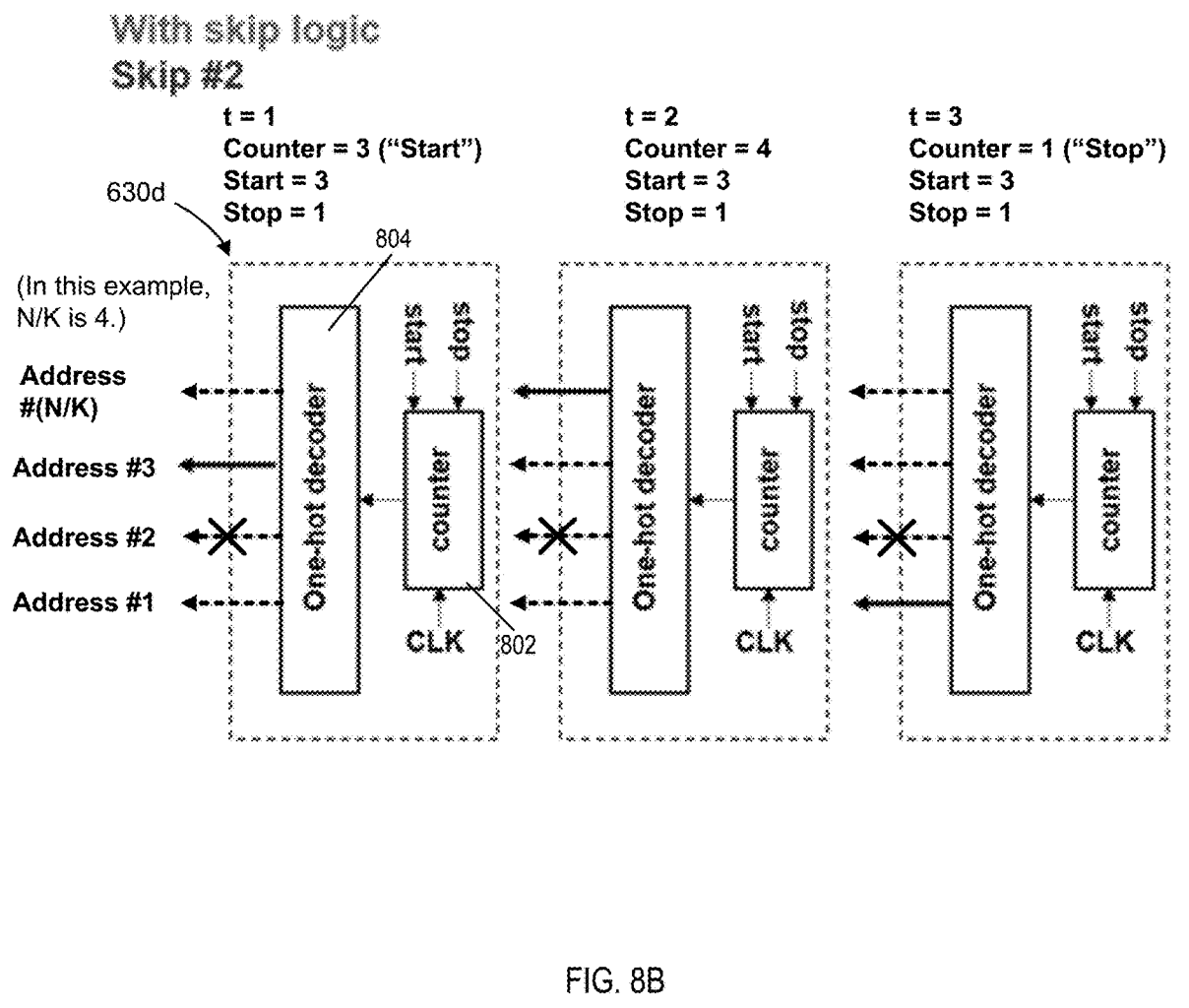

With skip logic
Skip #2 t = 1
Counter = 3 ("Start")
Start = 3
Stop = 1 t = 2
Counter = 4
Start = 3
Stop = 1 t = 3
Counter = 1 ("Stop")
Start = 3
Stop = 1

630d

804

(In this example, N/K is 4.)

Address #(N/K)

Address #3

Address #2

Address #1

One-hot decoder start    stop counter

CLK    802

One-hot decoder start    stop counter

CLK

One-hot decoder start    stop counter

CLK

FIG. 8B

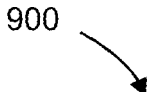

900

Transmit, by a light source, pulse trains over a plurality of time intervals as part of an optical measurement, wherein each of the pulse trains includes one or more pulses from the light source and corresponds to a different time interval
902

Detect, by a photosensor comprising one or more photodetectors, photons of the pulse trains to generate a plurality of signals over the plurality of time intervals for each of the one or more photodetectors, wherein a signal from a photodetector indicates whether a photon was detected during a time bin of a time interval
904

Receive, by an accumulation circuit, for each of a plurality of time bins in each of the plurality of time intervals, a set of signals from the one or more photodetectors and to aggregate a number of positive signals in the set of signals that indicate a detection of a photon, thereby generating a total signal count for the time bin for each time interval
906 storing, by a memory block corresponding to the photosensor, the total signal count for each of the plurality of time bins, wherein the accumulation circuit updates the total signal counts for the plurality of time bins for each time interval, wherein the memory block is partitioned into a plurality of memory bins, each memory bin storing the total signal count for one of the plurality of time bins, and wherein the number of memory bins is larger than the number of time bins, and wherein an address associated with a first memory bin having a faulty memory cell is skipped by an address generator
908

FIG. 9

ADDRESSING REDUNDANT MEMORY FOR LIDAR PIXELS

CROSS-REFERENCES TO RELATED APPLICATIONS

The present application claims priority from and is a non-provisional application of U.S. Provisional Application No. 63/297,622, entitled "Addressing Redundant Memory For Lidar Pixels" filed Jan. 7, 2022, the entire contents of which is herein incorporated by reference for all purposes.

BACKGROUND

This disclosure relates generally to lidar systems and more specifically to lidar systems resilient to faults.

Time of flight (ToF) based imaging is used in a number of applications, including range finding, depth profiling, and 3D imaging, such as light imaging, detection, and ranging (LiDAR, or lidar). Direct time of flight (dToF) measurement includes directly measuring the length of time between emitting radiation from emitter element(s) and sensing the radiation by detector element(s) after reflection from an object or other target. The distance to the target can be determined from the measured length of time. Indirect time of flight measurement includes determining the distance to the target by phase modulating the amplitude of the signals emitted by the emitter element(s) of the lidar system and measuring phases (e.g., with respect to delay or shift) of the echo signals received at the detector element(s) of the lidar system. These phases may be measured with a series of separate measurements or samples.

In specific applications, the sensing of the reflected radiation in either direct or indirect time of flight systems may be performed using an array of detectors, such as an array of Single Photon Avalanche Diodes (SPADs). One or more detectors may define a sensor (also referred to as a "pixel") of the sensor array used to generate a lidar image for the depth (range) to objects for respective pixels.

When imaging a scene, ToF sensors (also referred to as photosensors) for lidar applications can include circuits that time-stamp and/or count incident photons as reflected from a target. Data rates can be compressed by histogramming timestamps. For instance, for each pixel, a histogram having bins (also referred to as "time bins") corresponding to different ranges of photon arrival times can be stored in memory, and photon counts can be accumulated in different time bins of the histogram according to their arrival time. A time bin can correspond to a time range of, e.g., 1 ns, 2 ns, or the like.

Some lidar systems may perform in-pixel histogramming of incoming photons using a clock-driven architecture and a limited memory block, which may provide a significant increase in histogramming capacity. However, since memory capacity is limited and typically cannot cover the desired distance range at once, such lidar systems may operate in "strobing" mode. "Strobing" can refer to the generation of detector control signals (also referred to herein as "strobe signals" or "strobes") to control the timing and/or duration of activation (also referred to herein as "detection windows" or "strobe windows") of one or more detectors of the lidar system, such that photon detection and histogramming is performed sequentially over a set of different time windows, each corresponding to an individual distance subrange, so as to collectively define the entire distance range. In other words, partial histograms may be acquired for subranges or "time slices" corresponding to different sub-ranges of the distance range and then amalgamated into one full-range histogram. Thousands of time bins (each corresponding to respective photon arrival times) may typically be used to form a histogram sufficient to cover the typical time range of a lidar system (e.g., microseconds) with the typical time-to-digital converter (TDC) resolution (e.g., 50 to 100 picoseconds).

When a lidar system is used for transportation, there are safety concerns. Few errors can be tolerated. Thus, it is important to provide systems that are resilient to errors.

SUMMARY

Some embodiments of the disclosure pertain to a light ranging system and a method of operating the light ranging system.

According to some embodiments, a light ranging system is provided. The light ranging system includes: a light source configured to transmit pulse trains over a plurality of time intervals as part of an optical measurement, wherein each of the pulse trains includes one or more pulses from the light source and corresponds to a different time interval; a photosensor comprising one or more photodetectors configured to detect photons of the pulse trains to generate a plurality of signals over the plurality of time intervals for each of the one or more photodetectors, wherein a signal from a photodetector indicates whether a photon was detected during a time bin of a time interval; an accumulation circuit configured to receive, for each of a plurality of time bins in each of the plurality of time intervals, a set of signals from the one or more photodetectors and to aggregate a number of positive signals in the set of signals that indicate a detection of a photon, thereby generating a total signal count for the time bin for each time interval; a memory block corresponding to the photosensor and configured to store the total signal count for each of the plurality of time bins, wherein the accumulation circuit updates the total signal counts for the plurality of time bins for each time interval, wherein the memory block is partitioned into a plurality of memory bins, each memory bin storing the total signal count for one of the plurality of time bins, and wherein the number of memory bins is larger than the number of time bins; and an address generator configured to skip an address associated with a first memory bin having a faulty memory cell.

According to some embodiments, a method of operating a light ranging system is provided. The method includes the following steps: transmitting, by a light source, pulse trains over a plurality of time intervals as part of an optical measurement, wherein each of the pulse trains includes one or more pulses from the light source and corresponds to a different time interval; detecting, by a photosensor comprising one or more photodetectors, photons of the pulse trains to generate a plurality of signals over the plurality of time intervals for each of the one or more photodetectors, wherein a signal from a photodetector indicates whether a photon was detected during a time bin of a time interval; receiving, by an accumulation circuit, for each of a plurality of time bins in each of the plurality of time intervals, a set of signals from the one or more photodetectors and to aggregate a number of positive signals in the set of signals that indicate a detection of a photon, thereby generating a total signal count for the time bin for each time interval; and storing, by a memory block corresponding to the photosensor, the total signal count for each of the plurality of time bins, wherein the accumulation circuit updates the total signal counts for the plurality of time bins for each time interval, wherein the memory block is partitioned into a plurality of memory bins, each memory bin storing the total signal count for one of the plurality of time bins, and wherein the number of memory bins is larger than the number of time bins, and wherein an address associated with a first memory bin having a faulty memory cell is skipped by an address generator.

A better understanding of the nature and advantages of embodiments of the disclosed embodiments can be gained with reference to the following detailed description and the accompanying drawings. It is to be understood, however, that each of the figures is provided for the purpose of illustration only and is not intended as a definition of the limits of the scope of the invention. Also, as a general rule, and unless it is evident to the contrary from the description, where elements in different figures use identical reference numbers, the elements are generally either identical or at least similar in function or purpose.

BRIEF DESCRIPTION OF THE DRAWINGS

FIG. 3 illustrates the operation of a typical lidar system that may be improved by embodiments;

FIG. 6A illustrates an example configuration of a memory circuit implementing a memory pixel in accordance with some embodiments.

FIG. 6B shows the parallel arrangement and other components of the memory pixel in accordance with some embodiments.

FIG. 8B shows the operation of an address generator based on round robin addressing mechanisms with a skip logic according to some embodiments of the present disclosure.

FIG. 9 is a flowchart illustrating an example method 900 of operating a lidar sensor array according to some embodiments of the present disclosure.

DETAILED DESCRIPTION

In some implementations, memory is used devices are used in the sensor array to accumulate Time of Flight (ToF) information. As an example, the memory can be static random-access memory (SRAM). It should be understood that this is not intended to be limiting, and other types of memory devices such as dynamic random-access memory (DRAM) devices may be employed as well. A big SRAM chunk corresponding to the whole pixel array is typically needed. However, not all memory cells in the big SRAM chunk may function properly due to various reasons such as yield restrictions and address line faults. In other words, the SRAM chunk does not have a 100% yield. Typically, there are faulty memory cells randomly spread across the pixel array. As a result, ToF information that would be stored in those faulty memory cells would be incorrect or even lost. For example, a photon count associated with a faulty cell is incorrect or invalid. Therefore, there is a need to address the issues mentioned above related to faulty memory cells.

In accordance with some embodiments of the present disclosure, the issues are addressed by memory redundancy. For example, the memory block for each pixel is partitioned into multiple memory bins, and the number of memory bins is larger than the number of time bins. Once a faulty memory cell is identified, an address associated with the memory bin that has the faulty memory cell is skipped by an address generator. As such, the faulty memory cell is not used to store ToF information.

I. Example Lidar System

Figure 1:
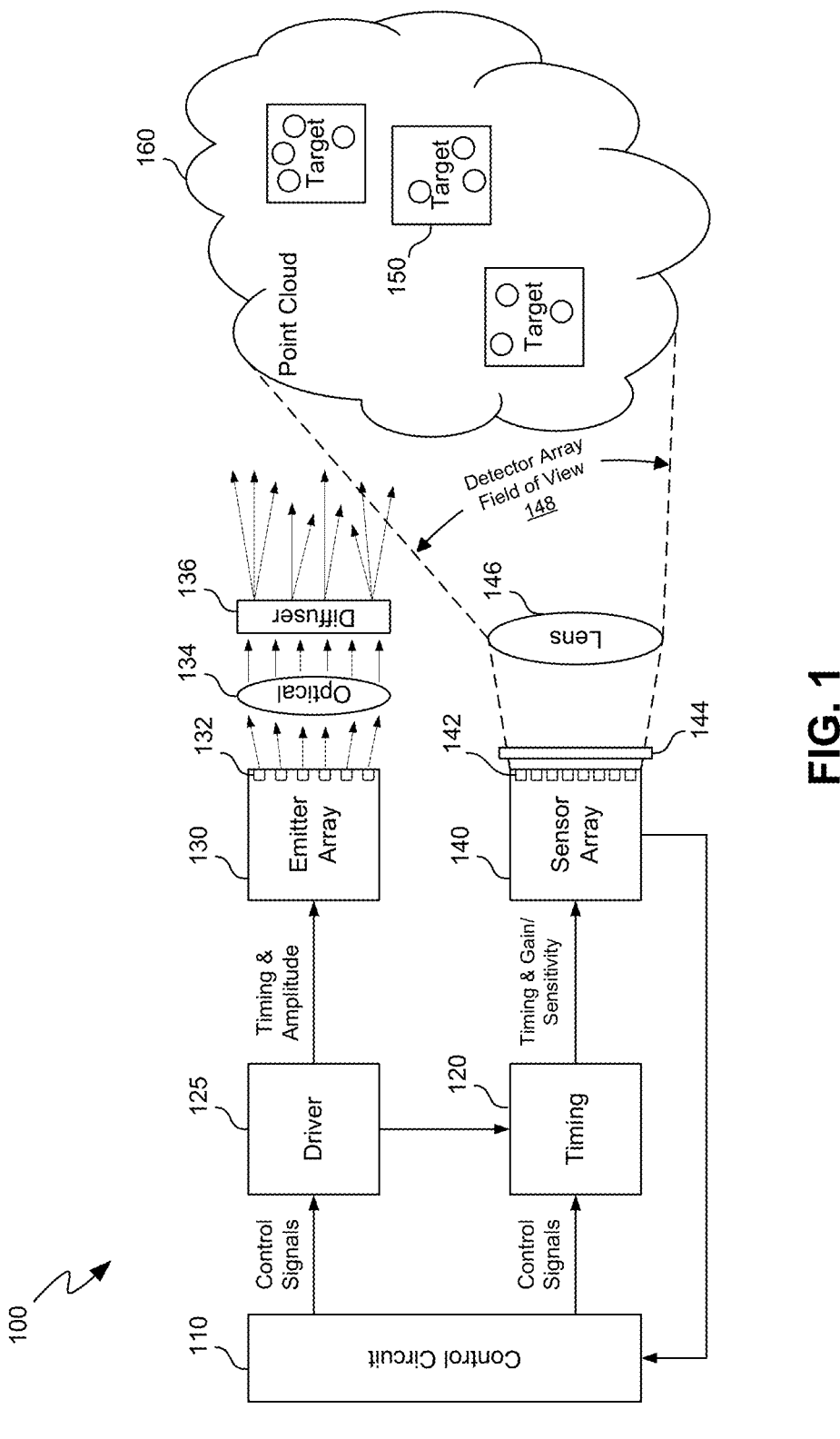
FIG. 1 is a simplified block diagram of a Light Detection and Ranging (lidar) system according to some embodiments.

FIG. 1 illustrates an example light-based 3D sensor system 100, such as a Light Detection and Ranging (LiDAR, or lidar) system, in accordance with some embodiments of the present disclosure. Lidar system 100 can include a control circuit 110, a timing circuit 120, driver circuitry 125, an emitter array 130 and a sensor array 140. Emitter array 130 can include a plurality of emitter units 132 arranged in an array (e.g., a one- or two-dimensional array) and sensor array 140 can include a plurality of sensors (also referred to as "pixels") 142 arranged in an array (e.g., a one- or two-dimensional array). The sensors 142 can be depth sensors, such as time-of-flight ToF sensors. In some embodiments, each sensor 142 can include, for example, an array of single-photon detectors, such as single photon avalanche diodes (SPADs). In some embodiments, each sensor 142 can be coupled to an in-pixel memory block (not shown) that accumulates histogram data for that sensor 142, and the combination of a sensor and in-pixel memory circuitry is sometimes referred to as a "pixel" 142. Each emitter unit 132 of the emitter array 130 can include one or more emitter elements that can emit a radiation pulse (e.g., light pulse) or continuous wave signal at a time and frequency controlled by a timing generator or driver circuitry 125. In some embodiments, the emitter units 132 can be pulsed light sources, such as LEDs or lasers such as vertical cavity surface emitting lasers (VCSELs) that emit a cone of light (e.g., infrared light) having a predetermined beam divergence.

Emitter array 130 can project pulses of radiation into a field of view of the lidar system 100. Some of the emitted radiation can then be reflected back from objects in the field, such as targets 150. The radiation that is reflected back can then be sensed or detected by the sensors 142 within the sensor array 140. Control circuit 110 can implement a processor that measures and/or calculates the distance to targets 150 based on data (e.g., histogram data) provided by sensors 142. In some embodiments, control circuit 110 can measure and/or calculate the time of flight of the radiation pulses over the journey from emitter array 130 to target 150 and back to the sensors 142 within the sensor array 140 using direct or indirect time of flight (ToF) measurement techniques.

In some embodiments, emitter array 130 can include an array (e.g., a one- or two-dimensional array) of emitter units 132 where each emitter unit is a unique semiconductor chip having one or more individual VCSELs (sometimes referred to herein as emitter elements) formed on the chip. An optical element 134 and a diffuser 136 can be disposed in front of the emitter units such that light projected by the emitter units passes through the optical element 134 (which can include, e.g., one or more Fresnel lenses) and then through diffuser 136 prior to exiting lidar system 100. In some embodiments, optical element 134 can be an array of lenses or lenslets (in which case the optical element is sometimes referred to herein as "lens array 134" or "lenslet array 134") that collimate or reduce the angle of divergence of light received at the array and pass the altered light to diffuser 136. The diffuser 136 can be designed to spread light received at the diffuser over an area in the field that can be referred to as the field of view of the emitter array (or the field of illumination of the emitter array). In general, in these embodiments, emitter array 130, lens array 134 and diffuser 136 cooperate to spread light from emitter array 130 across the entire field of view of the emitter array. A variety of emitters and optical components can be used.

The driver circuitry 125 can include one or more driver circuits each of which controls one or more emitter units. The driver circuits can be operated responsive to timing control signals with reference to a master clock and/or power control signals that control the peak power and/or the repetition rate of the light output by the emitter units 132. In some embodiments, each of the emitter units 132 in the emitter array 130 is connected to and controlled by a separate circuit in driver circuitry 125. In other embodiments, a group of emitter units 132 in the emitter array 130 (e.g., emitter units 132 in spatial proximity to each other or in a common column of the emitter array), can be connected to a same circuit within driver circuitry 125. Driver circuitry 125 can include one or more driver transistors configured to control the modulation frequency, timing, and/or amplitude of the light (optical emission signals) output from the emitter units 132.

In some embodiments, a single event of emitting light from the multiple emitter units 132 can illuminate an entire image frame (or field of view); this is sometimes referred to as a "flash" lidar system. Other embodiments can include non-flash or scanning lidar systems, in which different emitter units 132 emit light pulses at different times, e.g., into different portions of the field of view. The maximum optical power output of the emitter units 132 can be selected to generate a signal-to-noise ratio of the echo signal from the farthest, least reflective target at the brightest background illumination conditions that can be detected in accordance with embodiments described herein. In some embodiments, an optical filter (not shown) such as a bandpass filter can be included in the optical path of the emitter units 132 to control the emitted wavelengths of light.

Light output from the emitter units 132 can impinge on and be reflected back to lidar system 100 by one or more targets 150 in the field. The reflected light can be detected as an optical signal (also referred to herein as a return signal, echo signal, or echo) by one or more of the sensors 142 (e.g., after being collected by receiver optics 146), converted into an electrical signal representation (sometimes referred to herein as a detection signal), and processed (e.g., based on time of flight techniques) to define a 3-D point cloud representation 160 of a field of view 148 of the sensor array 140. In some embodiments, operations of lidar systems can be performed by one or more processors or controllers, such as control circuit 110.

Sensor array 140 includes an array of sensors 142. In some embodiments, each sensor 142 can include one or more photodetectors, e.g., SPADs. And in some particular embodiments, sensor array 140 can be a very large array made up of hundreds of thousands or even millions of densely packed SPADs. Receiver optics 146 and receiver electronics (including timing circuit 120) can be coupled to the sensor array 140 to power, enable, and disable all or parts of the sensor array 140 and to provide timing signals thereto. In some embodiments, sensors 142 can be activated or deactivated with at least nanosecond precision (supporting time bins of 1 ns, 2 ns etc.), and in various embodiments, sensors 142 can be individually addressable, addressable by group, and/or globally addressable. The receiver optics 146 can include a bulk optic lens that is configured to collect light from the largest field of view that can be imaged by the lidar system 100, which in some embodiments is determined by the aspect ratio of the sensor array combined with the focal length of the receiver optics 146.

In some embodiments, the receiver optics 146 can further include various lenses (not shown) to improve the collection efficiency of the sensors, and/or an anti-reflective coating (also not shown) to reduce or prevent detection of stray light. In some embodiments, a spectral filter 144 can be positioned in front of the sensor array 140 to pass or allow passage of 'signal' light (i.e., light of wavelengths corresponding to wavelengths of the light emitted from the emitter units) but substantially reject or prevent passage of non-signal light (i.e., light of wavelengths different from the wavelengths of the light emitted from the emitter units).

The sensors 142 of sensor array 140 are connected to the timing circuit 120. The timing circuit 120 can be phase-locked to the driver circuitry 125 of emitter array 130. The sensitivity of each of sensors 142 or of groups of sensors 142 can be controlled. For example, when the detector elements include reverse-biased photodiodes, avalanche photodiodes (APD), PIN diodes, and/or Geiger-mode avalanche diodes (e.g., SPADs), the reverse bias can be adjusted. In some embodiments, a higher overbias provides higher sensitivity.

In some embodiments, control circuit 110, which can be, for example, a microcontroller or microprocessor, provides different emitter control signals to the driver circuitry 125 of different emitter units 132 and/or provides different signals (e.g., strobe signals) to the timing circuit 120 of different sensors 142 to enable/disable the different sensors 142 so as to detect the echo signal (or returning light) from the target 150. The control circuit 110 can also control memory storage operations for storing data indicated by the detection signals in a non-transitory memory or memory array that is included therein or is distinct therefrom.

Figure 2:
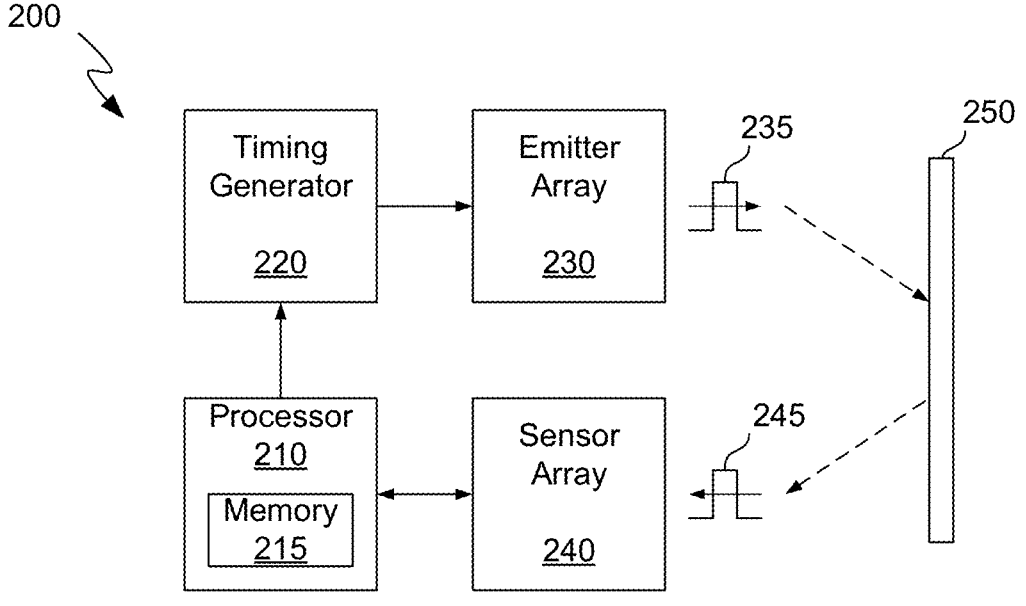
FIG. 2 is a simplified block diagram of components of a time-of-flight measurement system or circuit according to some embodiments.

FIG. 2 further illustrates components of a ToF measurement system or circuit 200 in a lidar application in accordance with some embodiments described herein. The circuit 200 can include a processor circuit 210 (such as a digital signal processor (DSP)), a timing generator 220 that controls timing of the illumination source (illustrated by way of example with reference to a laser emitter array 230), and an array of sensors (illustrated by way of example with reference to a sensor array 240). The processor circuit 210 can also include a sequencer circuit (not shown in FIG. 2) that is configured to coordinate operation of emitter units within the illumination source (emitter array 230) and sensors within the sensor array 240.

The processor circuit 210 and the timing generator 220 can implement some of the operations of the control circuit 110 and the driver circuitry 125 of FIG. 1. Similarly, emitter array 230 and sensor array 240 can be representative of emitter array 130 and sensor array 140 in FIG. 1. The laser emitter array 230 can emit laser pulses 235 at times controlled by the timing generator 220. Light 245 from the laser pulses 235 can be reflected back from a target (illustrated by way of example as object 250) and can be sensed by sensor array 240. The processor circuit 210 implements a pixel processor that can measure or calculate the time of flight of each laser pulse 235 and its reflected signal 245 over the journey from emitter array 230 to object 250 and back to the sensor array 240.

The processor circuit 210 can provide analog and/or digital implementations of logic circuits that provide the necessary timing signals (such as quenching and gating or strobe signals) to control operation of single-photon detectors of the sensor array 240 and that process the detection signals output therefrom. For example, individual single-photon detectors of sensor array 240 can be operated such that they generate detection signals in response to incident photons only during the gating intervals or strobe windows that are defined by the strobe signals, while photons that are incident outside the strobe windows have no effect on the outputs of the single photon detectors. More generally, the processor circuit 210 can include one or more circuits that are configured to generate detector control signals that control the timing and/or durations of activation of the sensors 142 (or particular single-photon detectors therein), and/or to generate respective emitter control signals that control the output of light from the emitter units 132.

Detection events can be identified by the processor circuit 210 based on one or more photon counts indicated by the detection signals output from the sensor array 240, which can be stored in a non-transitory memory 215. In some embodiments, the processor circuit 210 can include a correlation circuit or correlator that identifies detection events based on photon counts (referred to herein as correlated photon counts) from two or more single-photon detectors within a predefined window (time bin) of time relative to one another, referred to herein as a correlation window or correlation time, where the detection signals indicate arrival times of incident photons within the correlation window. Since photons corresponding to the optical signals output from the emitter array 230 (also referred to as signal photons) can arrive relatively close in time with each other, as compared to photons corresponding to ambient light (also referred to as background photons), the correlator can be configured to distinguish signal photons based on respective times of arrival being within the correlation time relative to one another. Such correlators and strobe windows are described, for example, in U.S. Patent Application Publication No. 2019/0250257, entitled "Methods and Systems for High-Resolution Long Range Flash Lidar," which is incorporated by reference herein in its entirety for all purposes.

The processor circuit 210 can be small enough to allow for three-dimensionally stacked implementations, e.g., with the sensor array 240 "stacked" on top of processor circuit 210 (and other related circuits) that is sized to fit within an area or footprint of the sensor array 240. For example, some embodiments can implement the sensor array 240 on a first substrate, and transistor arrays of the processor circuit 210 on a second substrate, with the first and second substrates/wafers bonded in a stacked arrangement, as described for example in U.S. Patent Application Publication No. 2020/0135776, entitled "High Quantum Efficiency Geiger-Mode Avalanche Diodes Including High Sensitivity Photon Mixing Structures and Arrays Thereof," the disclosure of which is incorporated by reference herein in its entirety for all purposes.

The pixel processor implemented by the processor circuit 210 can be configured to calculate an estimate of the average ToF aggregated over hundreds or thousands of laser pulses 235 and photon returns in reflected light 245. The processor circuit 210 can be configured to count incident photons in the reflected light 245 to identify detection events (e.g., based on one or more SPADs within the sensor array 240 that have been "triggered") over a laser cycle (or portion thereof).

The timings and durations of the detection windows can be controlled by a strobe signal (Strobe #i or Strobe<i>). Many repetitions of Strobe #i can be aggregated (e.g., in the pixel) to define a sub-frame for Strobe #i, with subframes i=1 to n defining an image frame. Each sub-frame for Strobe #i can correspond to a respective distance sub-range of the overall imaging distance range. In a single-strobe system, a sub-frame for Strobe #i can correspond to the overall imaging distance range and is the same as an image frame since there is a single strobe. The time between emitter unit pulses (which defines a laser cycle, or more generally emitter pulse frequency) can be selected to define or can otherwise correspond to the desired overall imaging distance range for the ToF measurement system 200. Accordingly, some embodiments described herein can utilize range strobing to activate and deactivate sensors for durations or "detection windows" of time over the laser cycle, at variable delays with respect to the firing of the laser, thus capturing reflected correlated signal photons corresponding to specific distance sub-ranges at each window/frame, e.g., to limit the number of ambient photons acquired in each laser cycle.

The strobing can turn off and on individual photodetectors or groups of photodetectors (e.g., for a pixel), e.g., to save energy during time intervals outside the detection window. For instance, a SPAD or other photodetector can be turned off during idle time, such as after an integration burst of time bins and before a next laser cycle. As another example, SPADs can also be turned off while all or part of a histogram is being read out from non-transitory memory 215. Yet another example is when a counter for a particular time bin reaches the maximum value (also referred to as "bin saturation") for the allocated bits in the histogram stored in non-transitory memory 215. A control circuit can provide a strobe signal to activate a first subset of the sensors while leaving a second subset of the sensors inactive. In addition or alternatively, circuitry associated with a sensor can also be turned off and on as specified times.

II. Detection of Reflected Pulses

The photosensors can be arranged in a variety of ways for detecting reflected pulses. For example, the photosensors can be arranged in an array, and each photosensor can include an array of photodetectors (e.g., SPADs). A signal from a photodetector indicates when a photon was detected and potentially how many photons were detected. For example, a SPAD can operate in a single-photon detection mode. This single-photon detection mode of operation is often referred to as "Geiger Mode," and an avalanche can produce a current pulse that results in a photon being counted. Other photodetectors (e.g., for an avalanche photodiode) can produce an analog signal (in real time) proportional to the number of photons detected. The signals from individual photodetectors can be combined to provide a signal from the sensor, which can be a digital signal. This signal can be used to generate histograms.

A. Time-of-Flight Measurements and Detectors

FIG. 3 illustrates the operation of a typical lidar system that may be improved by some embodiments. A laser or other emitter (e.g., within emitter array 230 or emitter array 130) generates a light pulse 310 of short duration. The horizontal axis represents time and the vertical axis represents power. An example laser pulse duration, characterized by the full-width half maximum (FWHM), is a few nanoseconds, with the peak power of a single emitter being around a few watts. Embodiments that use side emitter lasers or fiber lasers may have much higher peak powers, while embodiments with small diameter VCSELs could have peak powers in the tens of milliwatts to hundreds of milliwatts.

A start time 315 for the emission of the pulse does not need to coincide with the leading edge of the pulse. As shown, the leading edge of light pulse 310 may be after the start time 315. One may want the leading edge to differ in situations where different patterns of pulses are transmitted at different times, e.g., for coded pulses. In this example, a single pulse of light is emitted. In some embodiments, a sequence of multiple pulses can be emitted, and the term "pulse train" as used herein refers to either a single pulse or a sequence of pulses.

An optical receiver system (which can include, e.g., sensor array 240 or sensor array 140) can start detecting received light at the same time as the laser is started, i.e., at the start time. In other embodiments, the optical receiver system can start at a later time, which is at a known time after the start time for the pulse. The optical receiver system detects background light 330 initially and after some time detects the laser pulse reflection 320. The optical receiver system can compare the detected light intensity against a threshold to identify the laser pulse reflection 320. Where a sequence of pulses are emitted, the optical receiver system can detect each pulse. The threshold can distinguish the background light 330 from light corresponding to the laser pulse reflection 320.

The time-of-flight 340 is the time difference between the pulse 310 being emitted and the reflected pulse 320 being received. The time difference can be measured by subtracting the emission time of the pulse 310 (e.g., as measured relative to the start time) from a received time of the reflected pulse 320 (e.g., also measured relative to the start time). The distance to the target can be determined as half the product of the time-of-flight and the speed of light. Pulses from the laser device reflect from objects in the scene at different times, depending on start time and distance to the object, and the sensor array detects the pulses of reflected light.

B. Histogram Signals from Photodetectors

One mode of operation of a lidar system is time-correlated single photon counting (TCSPC), which is based on counting single photons in a periodic signal. This technique works well for low levels of periodic radiation which is suitable in a lidar system. This time correlated counting may be controlled by a periodic signal, e.g., from timing generator 220.

The frequency of the periodic signal can specify a time resolution within which data values of a signal are measured. For example, one measured value can be obtained for each photosensor per cycle of the periodic signal. In some embodiments, the measurement value can be the number of photodetectors that triggered during that cycle. The time period of the periodic signal corresponds to a time bin, with each cycle being a different time bin.

Figure 4:
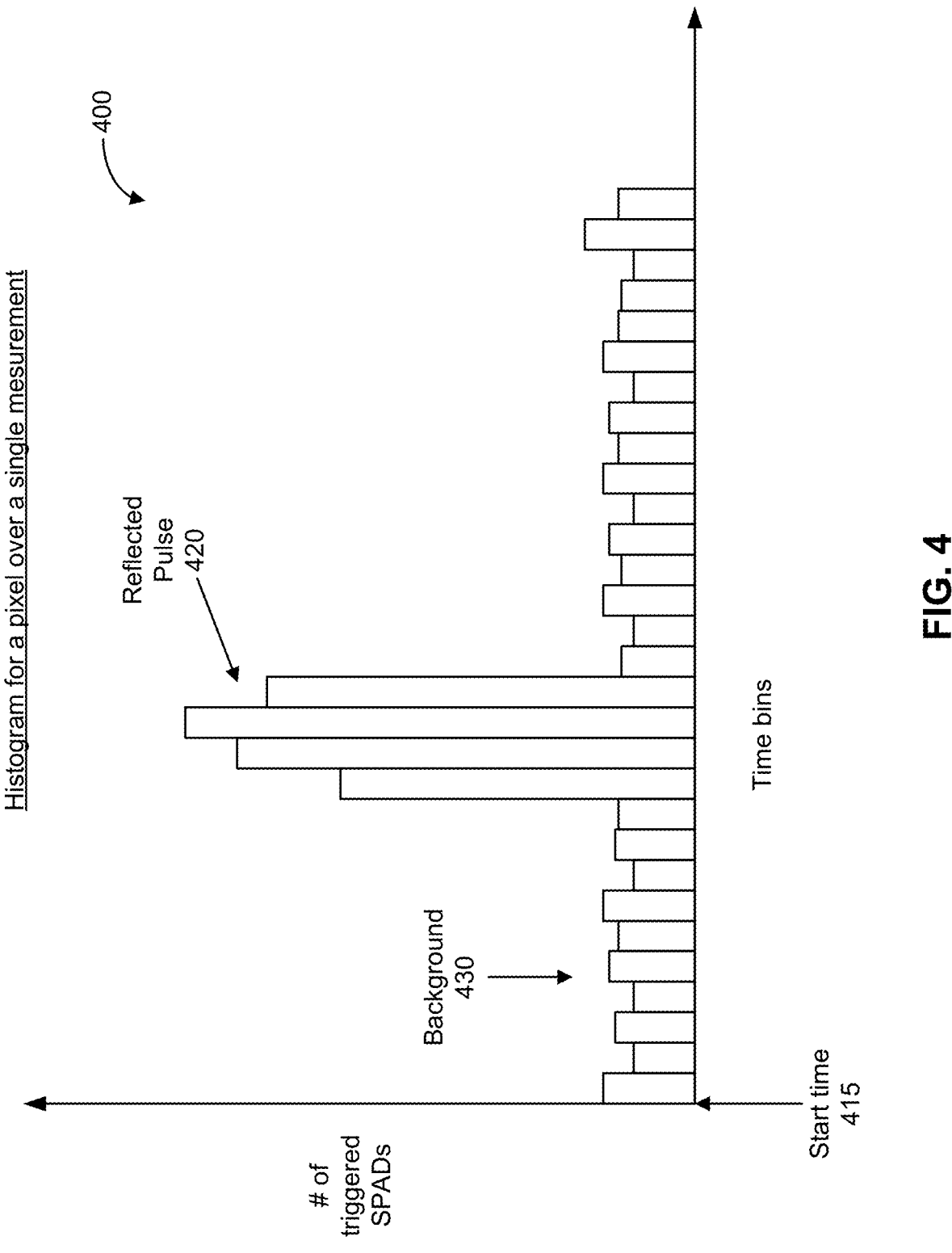
FIG. 4 shows a histogram according to embodiments of the present invention.

FIG. 4 shows a histogram 400 according to some embodiments described herein. The horizontal axis corresponds to time bins as measured relative to start time 415. As described above, start time 415 can correspond to a start time for an emitted pulse train. Any offsets between rising edges of the first pulse of a pulse train and the start time for either or both of a pulse train and a detection time interval can be accounted for when determining the received time to be used for the time-of-flight measurement. In this example, the sensor pixel includes a number of SPADs, and the vertical axis corresponds to the number of triggered SPADs for each time bin. Other types of photodetectors can also be used. For instance, in embodiments where APDs are used as photodetectors, the vertical axis may correspond to an output of an analog-to-digital converter (ADC) that receives the analog signal from an APD. It is noted that APDs and SPADS can both exhibit saturation effects. Where SPADs are used, a saturation effect can lead to dead time for the pixel (e.g., when all SPADs in the pixel are immediately triggered and no SPADs can respond to later-arriving photons). Where APDs are used, saturation can result in a constant maximum signal rather than the dead-time based effects of SPADs. Some effects can occur for both SPADs and APDs, e.g., pulse smearing of very oblique surfaces may occur for both SPADs and APDs.

The counts of triggered SPADs for each of the time bins correspond to the different bars in histogram 400. The counts at the early time bins are relatively low and correspond to background noise 430. At some point, a reflected pulse 420 is detected. The corresponding counts are much larger, and may be above a threshold that discriminates between background and a detected pulse. The reflected pulse 420 results in increased counts in four time bins, which might result from a laser pulse of a similar width, e.g., a 4 ns pulse when time bins are each 1 ns.

The temporal location of the time bins corresponding to reflected pulse 420 can be used to determine the received time, e.g., relative to start time 415. In some embodiments, matched filters can be used to identify a pulse pattern, thereby effectively increasing the signal-to-noise ratio and allowing a more accurate determination of the received time. In some embodiments, the accuracy of determining a received time can be less than the time resolution of a single time bin. For instance, for a time bin of 1 ns, a resolution of one time bin would correspond to a distance about 15 cm. However, it can be desirable to have an accuracy of only a few centimeters.

Accordingly, a detected photon can result in a particular time bin of the histogram being incremented based on its time of arrival relative to a start signal, e.g., as indicated by start time 415. The start signal can be periodic such that multiple pulse trains are sent during a measurement. Each start signal can be synchronized to a laser pulse train, with multiple start signals causing multiple pulse trains to be transmitted over multiple laser cycles (also sometimes referred to as "shots"). An entire measurement can be over a measurement time interval (or just "measurement interval"), which may equal N detection intervals of an optical measurement or be longer, e.g., when pauses occur between detection intervals. Thus, a time bin (e.g., from 200 to 201 ns after the start signal) would occur for each detection interval. A shot can occur over a detection time interval (also referred to as a detection interval, time interval, or laser cycle). The histogram can accumulate the counts, with the count of a particular time bin corresponding to a sum of the measured data values all occurring in that particular time bin across multiple shots. When the detected photons are histogrammed based on such a technique, the result can be a return signal having a signal to noise ratio greater than that from a single pulse train by the square root of the number of shots taken.

Figure 5:
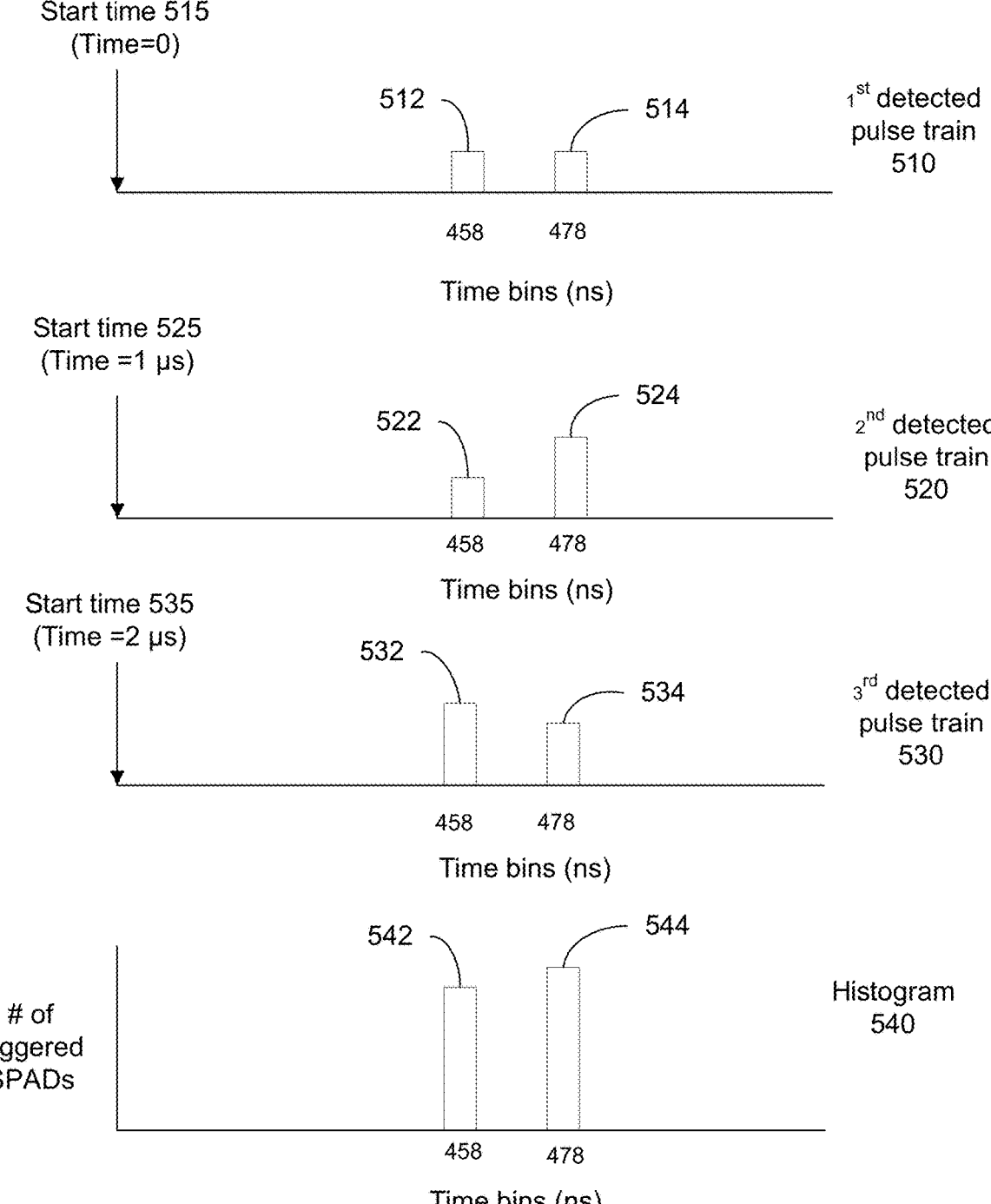
FIG. 5 shows the accumulation of a histogram over multiple pulse trains for a selected pixel according to embodiments of the present invention.

FIG. 5 shows the accumulation of a histogram over multiple pulse trains for a selected pixel according to some embodiments described herein. FIG. 5 shows three detected pulse trains 510, 520 and 530. Each detected pulse train corresponds to a transmitted pulse train that has a same pattern of two pulses separated by a same amount of time. Thus, each detected pulse train has a same pulse pattern, as shown by two time bins having an appreciable value. Counts for other time bins are not shown for simplicity of illustration, although the other time bins may have non-zero values (generally lower than the values in time bins corresponding to detected pulses).

In the first detected pulse train 510, the counts for time bins 512 and 514 are the same. This can result from a same (or approximately the same) number of photodetectors detecting a photon during each of the two time bins, or approximately the same number of photons being detected during the two time bins, depending on the particular photodetectors used. In other embodiments, more than one consecutive time bin can have a non-zero value; but for ease of illustration, individual nonzero time bins have been shown.

Time bins 512 and 514 respectively occur 458 ns and 478 ns after start time 515. The displayed counters for the other detected pulse trains occur at the same time bins relative to their respective start times. In this example, start time 515 is identified as occurring at time 0, but the actual time is arbitrary. The first detection interval for the first detected pulse train can be 1 μs. Thus, the number of time bins measured from start time 515 can be 1,000. After, this first detection interval ends, a new pulse train can be transmitted and detected. The start and end of the different time bins can be controlled by a clock signal, which can be part circuitry that acts as a time-to-digital converter (TDC).

For the second detected pulse train 520, the start time 525 is at 1 μs, at which time the second pulse train can be emitted. Time between start time 515 and start time 525 can be long enough that any pulses transmitted at the beginning of the first detection interval would have already been detected, and thus not cause confusion with pulses detected in the second detection interval. For example, if there is not extra time between shots, then the circuitry could confuse a retroreflective stop sign at 200 m with a much less reflective object at 50 m (assuming a laser cycle of about 1 us). The two detection time intervals for pulse trains 510 and 520 can be the same length and have the same relationship to the respective start time. Time bins 522 and 524 occur at the same relative times of 458 ns and 478 ns as time bins 512 and 514. Thus, when the accumulation step occurs, the corresponding counters can be added. For instance, the counter values at time bin 512 and 522 can be added together.

For the third detected pulse train 530, the start time 535 is at 2 μs, at which time the third pulse train can be emitted. Time bin 532 and 534 also occur at 458 ns and 478 ns relative to start time 535. The counts for corresponding pulses of different pulse trains (as evidenced by the counters) may have different values even though the emitted pulses have a same power, e.g., due to the stochastic nature of the scattering process of light pulses off of objects.

Histogram 540 shows an accumulation of the counts from three detected pulse trains 510, 520, 530 at time bins 542 and 544, which also correspond to 458 ns and 478 ns. Histogram 540 can have fewer time bins than were measured during the respective detection intervals, e.g., as a result of dropping time bins in the beginning or the end of the detection interval or time bins having values less than a threshold. In some implementations, about 10-30 time bins can have appreciable values, depending on the pattern for a pulse train.

As examples, the number of pulse trains emitted during a measurement to create a single histogram can be around 1-40 (e.g., 24), but can also be much higher, e.g., 50, 100, 500, or 1000. Once a measurement is completed, the counts for the histogram can be reset, and another set of pulse trains can be emitted to perform a new measurement. In various embodiments and depending on the number of detection intervals in the respective measurement cycles, measurements can be performed, e.g., every 25, 50, 100, or 500 μs. In some embodiments, measurement intervals can overlap, e.g., so that a given histogram corresponds to a particular sliding window of pulse trains. In such an example, memory can be provided for storing multiple histograms, each corresponding to a different time window. Any weights applied to the detected pulses can be the same for each histogram, or such weights could be independently controlled.

III. Memory Pixel Configuration

As mentioned above, memory devices (e.g., SRAM) are used in the sensor array 140 to accumulate ToF information. A big memory chunk corresponding to the whole sensor array can store the counts in the histograms for the pixels. The big memory chunk is partitioned into smaller memory blocks, one for each pixel. A memory pixel can include a memory block and related circuitry for creating a histogram for the pixel. There is a memory pixel for each pixel.

FIG. 6A illustrates an example configuration of a memory circuit implementing a memory pixel 600 (e.g., an SRAM pixel or DRAM pixel) in accordance with some embodiments. In particular, the memory pixel 600 of FIG. 6A may represent a lower or bottom tier of a pixel layout, for example, on which one or more pixels may be stacked to define a three-dimensionally stacked implementation. Multiple memory pixels 600 of FIG. 6A may thus be sized to fit within the area or footprint of the sensor array 140.

In the example shown in FIG. 6A, the memory pixel 600 includes a photodetector interface circuit 610 configured to receive detection signals from one or more photodetectors (e.g., SPADs). Memory pixel 600 can also include a sampler circuit 602 (illustrated as a sampler) configured to sample the detection signals output from the photodetectors. Memory pixel 600 can a memory block 605a configured to store histogram data (illustrated as a N×M memory device, where N refers to the number of memory bins and M refers to the bits per memory bin). Memory pixel 600 can also include multiple (e.g., four in the example shown in FIG. 6A) memory controller circuits 605c (illustrated as M-bit accumulation logic, corresponding to the number of bit lines M in the memory block 605a) that are configured to manage operations of the interface circuit 610, the sampler circuit 602, and the memory block 605a to store and integrate data indicated by the detection signals output from the photodetectors into the histogram data. It should be understood that the memory pixel 600 may include other components (e.g., a timing control logic, an address generator).

The accumulation logic 605c can perform precharge-read-modify-write (PRMW) over 4 clock cycles to update the counts within 4 memory bins in a given row of memory block 605a, using the new photon counts in a most recent 4 time bins. Such an operation can be repeated for other memory bins for a given laser cycle, thereby updating the histogram of photon counts for each laser cycle. The accumulation logic 605c can include various forms of arithmetic logic units (ALUs), including a combination of a standard ALU that counts in binary form and a linear-feedback shift register (LFSR), where final values can be mapped to a binary number.

In the example shown in FIG. 6A, the memory block 605a can be partitioned into a number K of parallel memory banks. Embodiments of the present disclosure are described herein with reference to examples where K=4, but it will be understood that K may be any number of parallel memory banks (i.e., 2 or more). The number of parallel memory banks K may also be referred to as the parallelism factor. The number of memory controller circuit 605c is K as well. It should be understood that the memory block 605a does not have to be partitioned into two or more parallel memory banks. The techniques described in the present disclosure is also applicable to a memory block without parallel memory banks (i.e., just one memory bank).

FIG. 6A illustrates a highly parallel arrangement in accordance with some embodiments of the present disclosure, where the M-bit PRMW logic controller circuit 605c is shared by the K memory banks. That is, the four parallel memory banks of the memory block 605a are connected to four accumulation logic circuits 605c. FIG. 6B shows the parallel arrangement and other components of the memory pixel 600 in greater detail.

In addition, as shown in FIGS. 6A and 6B, the memory pixel 600 further includes additional memory devices, implemented in this example by a partial pipeline memory device 605b1 and a temporary memory 605b2. The partial pipeline memory device 605b1 functions as a shift register, while the temporary memory 605b2 functions a temporary storage register. Both the partial pipeline memory 605b1 and the temporary memory 605b2 are of a size or capacity corresponding to the number of memory banks K (i.e., K-bits), which may be small compared to number of bits N×M in the memory block 605a. In this example, the number of bins N=48, the number of bits per bin M=10, and the N×M main memory is partitioned or split into K=4 banks of N/K=12 bins per bank. The address generator 630 has N/K=12 bits, each corresponding to an address, which is shared by K memory bins.

As the memory block 605a is partitioned into K memory banks, K memory bins can be addressed in parallel, which may reduce addressing circuit requirements, and may reduce the impact of bit line parasitic on the temporal resolution.

IV. Memory Redundancy (More Memory Bins than Time Bins)

As mentioned above, there are faulty memory cells randomly spread across the pixel array. As a result, ToF information that is supposed to be stored in those faulty memory cells is incorrect or even lost. In accordance with embodiments of this disclosure, the memory block 605a has more memory bins than actually needed (i.e., "memory redundancy"). As such, even when there are some faulty memory cells located in one or more memory bins, there are enough redundant memories to be used as substitutes so that each time bin has its corresponding memory bin that functions properly. In this way, the risk of having incorrect ToF information or even losing some ToF information is significantly mitigated. The more memory redundancy is provided, the more the safe margin is achieved.

Assuming that n time bins are used for histogramming, the memory block 605a needs n faultless memory bins, because each time bin needs one corresponding faultless memory bin. In order to provide some memory redundancy, the memory block 605a is configured to have N memory bins, and N is a larger number than n. The redundant (N−n) memory bins, therefore, serve as backup. The redundancy can be quantified by a redundancy ratio (N−n)/n.

In one example, the number n of time bins is 44, while the number N of memory bins is 48, as shown in FIGS. 6A and 6B. Thus, four memory bins are redundant, and the redundancy ratio is 1/11 (i.e. about 9.09%).

In another example, the number n of time bins is 40, while the number N of memory bins is 48, as shown in FIGS. 6A and 6B. Thus, eight memory bins are redundant, and the redundancy ratio is 1/5 (i.e., 20%).

The memory pixel 600 receives information on faulty memory cells in the memory block 605a. In one implementation, the information on faulty memory cells is obtained by testing the whole memory chunk comprised of many memory pixels. The testing can be done by either the manufacturer of the memory chunk or the user. In one example, a known value (e.g., 0 or 1) is written to each memory cell and then read from each memory cell. If the readout value differs from the known value, the memory cell is considered a faulty memory cell. Once the testing is done, information on faulty memory cells becomes available. For example, it is known that each faulty memory cell belongs to which memory bin, and the memory bin is located at which memory pixel. If there is a faulty memory cell existing in the current memory pixel, the address generator 630 or another component (e.g., a controller circuit) determines an address associated with the faulty memory cell. For example, if memory bin 5 shown in FIG. 6B has a faulty memory cell, the address generator 630 or another component can determine that the address associated with the faulty memory cell is Address #2, which corresponds to memory bins 5-8.

In some embodiments, the information on faulty memory cells can be obtained and updated by subsequent testing. In other words, new faulty memory cells developing after the initial testing can be identified.

Once the address (e.g., Address #2 in the example described above) associated with the faulty memory cell is determined, the address generator 630 can skip that address. In some implementations, the address generator 630 is configured or programmed or set to skip the address. Examples of the configuration or programming of the address generator 630 are described below with reference to FIGS. 7A-8B. As a result, the memory bins (e.g., memory bins 5-8 in the example described above) corresponding to that address are not used to store ToF information. That is, when it is time to store an aggregation of the total signal counts for each of the time bins corresponding to the memory bins (e.g., memory bins 5-8 in the example described above), the aggregation is not stored in any of those corresponding memory bins associated with the determined address (e.g., Address #2 in the example described above) but in memory bins associated with another address (e.g., Address #3 in the example described above). In other words, no ToF information is lost, and it is simply stored at another place (i.e., a different memory bin).

There are at least two embodiments of implementing the address generator, namely a shift-register-based implementation and a counter-based implementation, which will be described in detail below. In both embodiments, the address generator is configured or programmed or set, after the address is determined, such that the address is skipped.

Moreover, the techniques described in the present disclosure are applicable to both a memory block with K parallel memory banks and a memory block without parallel memory banks (i.e., just one memory bank).

It should be understood that the address generator could be either specific to a single memory pixel or shared by two or more memory pixels. Additionally, the memory redundancy and address skipping are seamless from the perspective of the pixel histogramming process because all ToF information is obtained and stored, just in different memory bins.

V. Example Techniques to Skip Faulty Memory Cells

As mentioned above, there are at least two ways to implement the address generator, namely a shift-register-based implementation and a counter-based implementation. In both implementations, the address generator is configured or programmed or set such that the address associated with the faulty memory cell is skipped. As a result, the memory bins associated with the skipped address are not used to store ToF information. It should be understood that these techniques described herein are exemplary and not intended to be limiting.

A. Address Generator Based on Shift Register

Figure 7A:
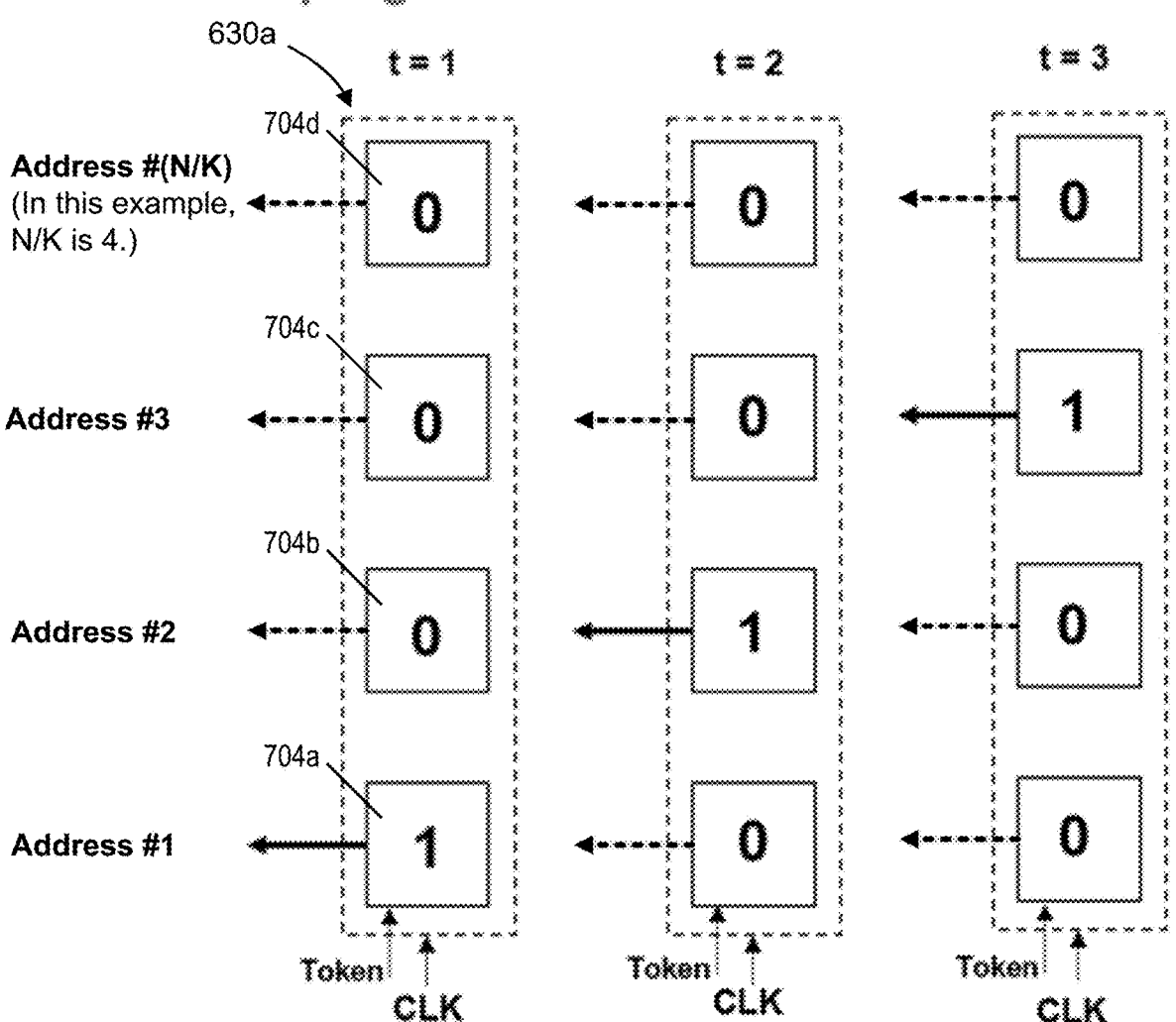
FIG. 7A shows the operation of an address generator based on a shift register without a skip logic.
Figure 7B:
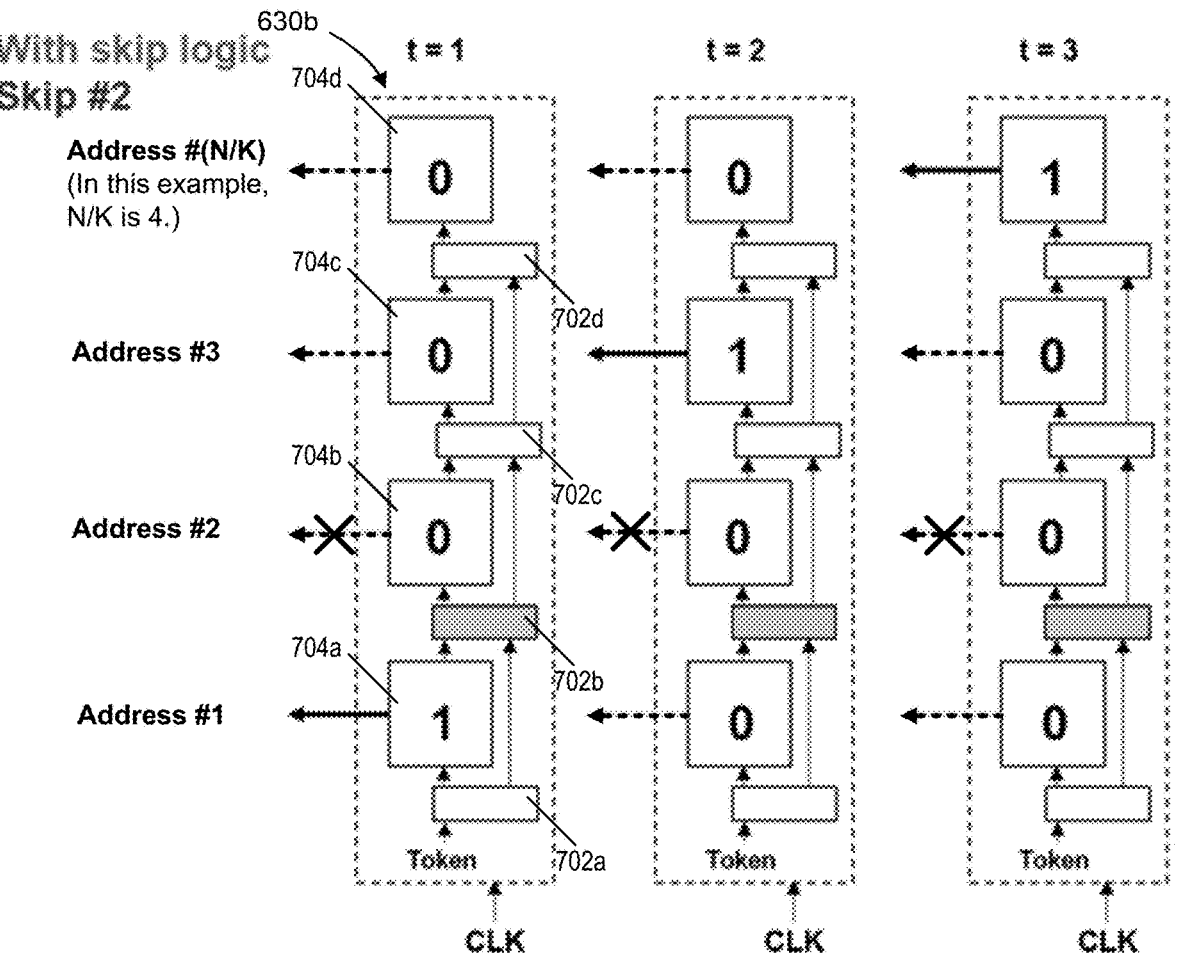
FIG. 7B shows the operation of an address generator based on a shift register with a skip logic according to some embodiments of the present disclosure.

FIG. 7A shows the operation of an address generator based on a shift register without a skip logic. FIG. 7B shows the operation of an address generator based on a shift register with a skip logic according to some embodiments of the present disclosure.

As shown in FIG. 7A, the address generator 630a is based on a shift register comprised of multiple (e.g., four in this example) flip flops 704a-704c. Each of the flip flops 704a-704c is edge-triggered and operates at the given clock frequency. At different times, updated values for different time bins can be made to the corresponding memory bins. For example, memory bins 1-4 (corresponding to address #1) can be updated over clock cycles 1-4, with completion on cycle 4, which can correspond to a first time t=1. Then, memory bins 5-8 (corresponding to a subsequent address) can be updated over clock cycles 5-8, with completion on cycle 8, which can correspond to a second time t=2. The clock signal CLK is shown at the bottom of the shift register 630a. A token, shown at the bottom of the register 630a, is used as an input of the address generator 630a. The token passes from the flip flops 704a, 704b, 704c, and 704d in turn.

As a result, the output of the address generator 630a changes from Address #1 at the first time (i.e., t=1, as shown in FIG. 7A) to Address #2 at the second time (i.e., t=2, as shown in FIG. 7A) and to Address #3 at the third time (i.e., t=3, as shown in FIG. 7A). When the output address is Address #1, all memory bins (e.g., memory bins 1-4) associated with Address #1 are scanned through. When the output address is Address #2, all memory bins (e.g., memory bins 5-8) associated with Address #2 are scanned through. Assuming that there is at least one faulty memory cell located in one memory bin (e.g., memory bin 5) associated with Address #2, ToF information is stored in that memory bin (e.g., memory bin 5) that has the faulty memory cell. Therefore, there is a risk of having an incorrect or invalid photon count.

FIG. 7B shows an address generator 630b having skip logic implemented in a shift register comprised of multiple (e.g., four in this example) flip flops. Each flip flop is edge-triggered and operates at the given clock frequency. In one example, the clock signal is generated from the pixel control logic and derived from the pixel sampling clock signal.

Different from the shift register 630a, flip flops 704a, 704b, 704c, and 704d have corresponding multiplexers 702a, 702b, 702c, and 702d. When the address generator 630 is programmed, the token can bypass a certain flip flop through its corresponding multiplexer (in the example shown in FIG. 7B, the multiplexer 702b). Assuming again that there is at least one faulty memory cell located in one memory bin (e.g., memory bin 5) associated with Address #2, the multiplexer 702 corresponding to Address #2 is programmed so that the token signal bypasses the flip flop 704b corresponding to Address #2. As a result, at the second time (i.e., t=2, as shown in FIG. 7B), the output of the address generator 630b is Address #3 instead of Address #2. Therefore, the memory bin (e.g., memory bin 5) where the at least one faulty memory cell is located has been skipped.

It should be understood that although the address generator 630b is 4-bit (i.e., N/K is four) in the example shown in FIG. 7B, this is not intended to be limiting. The techniques described herein are generally applicable to other values (e.g., 12) of N/K.

B. Address Generator Based on Round Robin Addressing Mechanisms

Figure 8A:
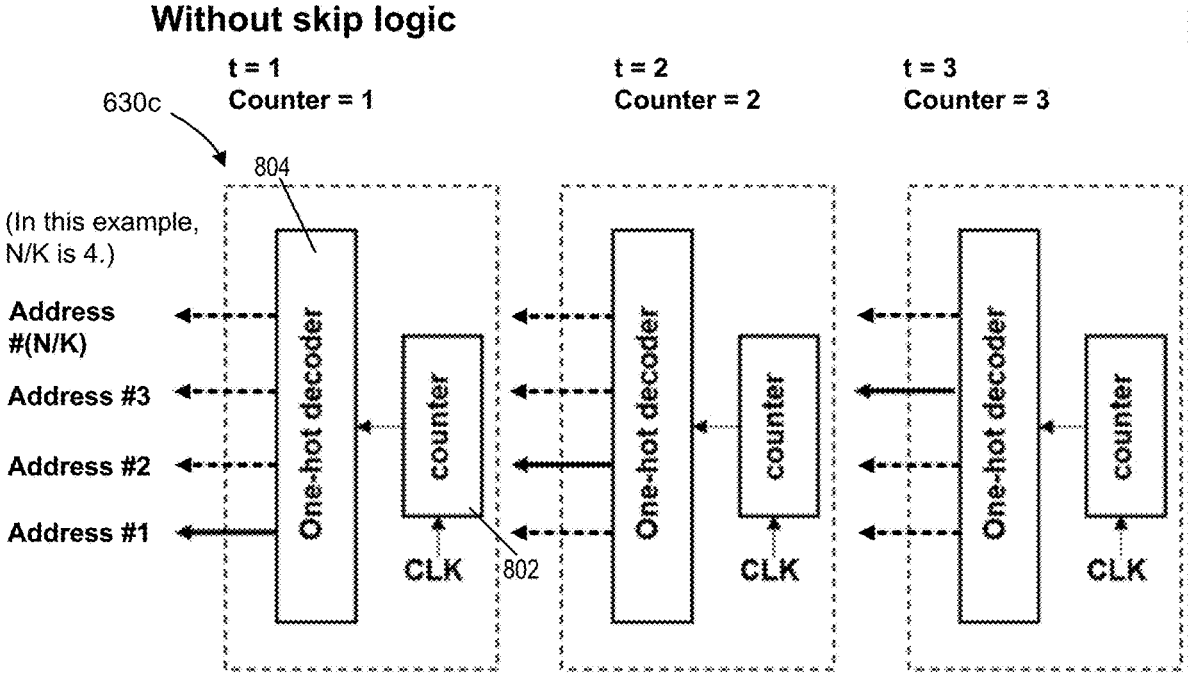
FIG. 8A shows the operation of an address generator based on round robin addressing mechanisms without a skip logic.

FIG. 8A shows the operation of an address generator based on round robin addressing mechanisms without a skip logic. FIG. 8B shows the operation of an address generator based on round robin addressing mechanisms with a skip logic according to some embodiments of the present disclosure.

As shown in FIG. 8A, the address generator 630c includes a counter 802. The counter 802 starts from a start position (e.g., 1) and increments by one in accordance with the clock signal, shown at the bottom of the counter 802. In one example, the clock signal is generated from the pixel control logic and derived from the pixel sampling clock signal. The value of the counter is fed to a one-hot decoder 804, which converts the value of the counter 802 to an output of the address generator 630c. At any time, only one address is selected by the one-hot decoder 804, based on the value of the counter 802. For example, at the first time (i.e., t=1, as shown in FIG. 8A), the value of the counter 802 is 1, so Address #1 is the only address selected by the one-hot decoder 804.

As a result, the output of the address generator 630c changes from Address #1 at the first time (i.e., t=1, as shown in FIG. 8A) to Address #2 at the second time (i.e., t=2, as shown in FIG. 8A) and to Address #3 at the third time (i.e., t=3, as shown in FIG. 8A). This is sometimes referred to as a "round robin addressing mechanism."

Assuming that there is at least one faulty memory cell located in one memory bin (e.g., memory bin 5) associated with Address #2, ToF information is stored in that memory bin (e.g., memory bin 5) that has the faulty memory cell. Therefore, there is a risk of having an incorrect or invalid photon count.

FIG. 8B shows an address generator 630d with a counter having a programmable start position and a programmable stop position. The counter starts from the start position (e.g., 3, as shown in FIG. 8B) and increments by one in accordance with the clock signal until it reaches the stop position (e.g., 1, as shown in FIG. 8B). Therefore, any value (e.g., 2, as shown in FIG. 8B) between the stop position and the start position is skipped. The start position is often set to be a succeeding address (e.g., plus one, plus two, and the like) of the address associated with the faulty memory cell. The stop position is set to be a preceding address (e.g., minus one, minus two, and the like) of the address associated with the faulty memory cell.

Likewise, the value of the counter is fed to a one-hot decoder, which converts the value of the counter to an output of the address generator 630d. At a given time, only a single address is selected as the output of the address generator 630d. As a result, the output of the address generator 630c changes from Address #3 at the first time (i.e., t=1, as shown in FIG. 8B) to Address #4 at the second time (i.e., t=2, as shown in FIG. 8A) and to Address #1 at the third time (i.e., t=3, as shown in FIG. 8A).

It should be understood that although the address generator 630b is 4-bit (i.e., N/K is four) in the example shown in FIG. 8B, this is not intended to be limiting. The techniques described herein are generally applicable to other values (e.g., 12) of N/K. Moreover, as the start position and the stop position can be easily programmed, the techniques described herein are very flexible. They can be applied to skip two or more addresses. For example, for an 8-bit address generator, Address #3, Address #4, Address #5 can be skipped by setting the start position as 6 and the stop position as 2.

Also, the techniques described herein can be applied to multiple faulty memory cells in one memory block. For example, for an 8-bit address generator, faulty memory cells associated with Address #3 and Address #6 are identified. Because Address #6 should be skipped, Address #7 is set as the start position, and Address #5 is set as the stop position. Because Address #3 should be skipped, Address #4 is set as the start position, and Address #2 is set as the stop position. Therefore, Address #3 and Address #6 are effectively skipped based on those two start positions and two stop positions. The round robin addressing mechanisms can also be implemented using shift registers (e.g., as in FIG. 7B with the token looping back to the multiplexer 702a and the flip flop 704a).

VI. Method of Operation to Use Memory Redundancy

As explained above, a method of operating a lidar sensor array is provided. By having more memory bins than actually needed (i.e., "memory redundancy"), there are enough redundant memories to be used as substitutes so that each time bin has its corresponding memory bin that functions properly.

FIG. 9 is a flowchart illustrating an example method 900 of operating a light ranging system according to some embodiments of the present disclosure. The light ranging system is, for example, the lidar system 100 shown in FIG. 1. At operation 902, a light source (e.g., the emitter array 130, as shown in FIG. 1) transmits pulse trains over a plurality of time intervals as part of an optical measurement. Each of the pulse trains includes one or more pulses from the light source and corresponds to a different time interval.

At operation 904, a photosensor (e.g., the sensor or pixel 142, as shown in FIG. 1) including one or more photodetectors (e.g., SPADs) detects photons of the pulse trains to generate a plurality of signals over the plurality of time intervals for each of the one or more photodetectors. A signal from a photodetector indicates whether a photon was detected during a time bin of a time interval.

At operation 906, an accumulation circuit (e.g., the accumulation logic 605c, as shown in FIG. 6A) receives, for each of a plurality of time bins in each of the plurality of time intervals, a set of signals from the one or more photodetectors and to aggregate a number of positive signals in the set of signals that indicate a detection of a photon. As such, a total signal count for the time bin for each time interval is generated.

At operation 908, a memory block (e.g., the memory block 605a, as shown in FIG. 6A) corresponding to the photosensor (e.g., the sensor or pixel 142, as shown in FIG. 1) stores the total signal count for each of the plurality of time bins. The accumulation circuit updates the total signal counts for the plurality of time bins for each time interval. The memory block is partitioned into a plurality of memory bins (e.g., bins 1-48, as shown in FIG. 6B), and each memory bin stores the total signal count for one of the plurality of time bins. The number of memory bins is larger than the number of time bins. An address (e.g., Address #1, as shown in FIG. 7B) associated with a first memory bin having a faulty memory cell is skipped by an address generator (e.g., the address generator 630b, as shown in FIG. 7B).

VII. Multiple Lidar Units

Figure 10:
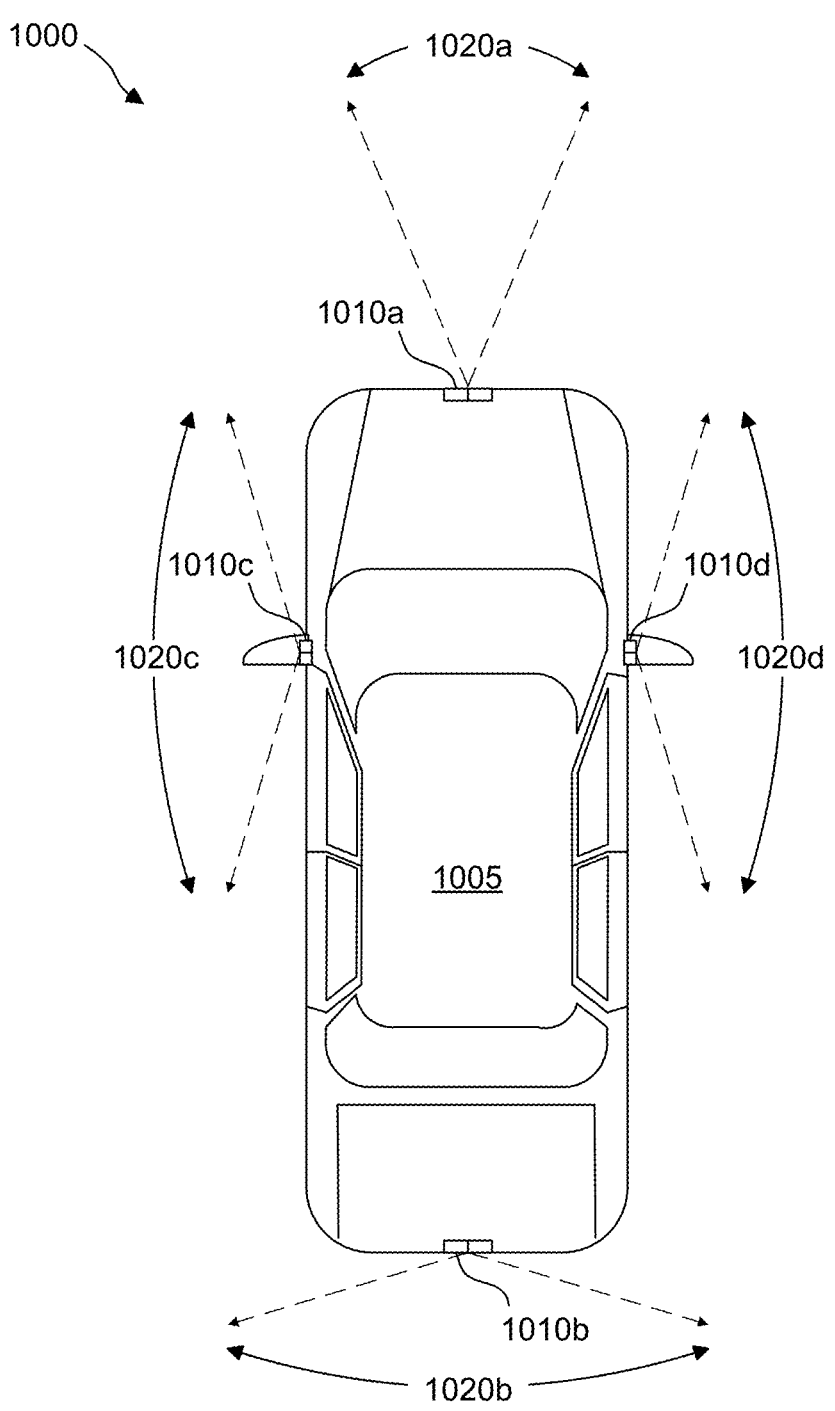
FIG. 10 is a simplified illustration of an automobile in which multiple solid-state flash lidar sensors according to some embodiments are included at different locations along the vehicle.

Depending on their intended purpose or application, lidar sensors can be designed to meet different FOV and different range requirements. For example, an automobile (e.g., a passenger car) outfitted with lidar for autonomous driving might be outfitted with multiple separate lidar sensors including a forward-facing long range lidar sensor, a rear-facing short range lidar sensor and one or more short range lidar sensors along each side of the car. FIG. 10 is a simplified illustration of an automobile 1000 in which four solid-state flash lidar sensors 1010a-d are included at different locations along the automobile. The number of lidar sensors, the placement of the lidar sensors, and the fields of view of each individual lidar sensors can be chosen to obtain a majority of, if not the entirety of, a 360-degree field of view of the environment surrounding the vehicle some portions of which can be optimized for different ranges. For example, lidar sensor 1010a, which is shown in FIG. 10 as being positioned along the front bumper of automobile 1000, can be a long range (200 meter), narrow field of view unit, while lidar sensors 1010b, positioned along the rear bumper, and lidar systems 1010c, 1010d, positioned at the side mirrors, are short range (50 meter), wide field of view systems.

Despite being designed for different ranges and different fields of view, each of the lidar sensors 1010a-1010d can be a lidar system according to embodiments disclosed herein. Indeed, in some embodiments, the only difference between each of the lidar sensors 1010a-1010d is the properties of the diffuser (e.g., diffuser 136). For example, in long range, narrow field of view lidar sensor 1010a, the diffuser 136 is engineered to concentrate the light emitted by the emitter array of the lidar system over a relatively narrow range enabling the long distance operation of the sensor. In the short range, wide field of view lidar sensor 1010b, the diffuser 136 can be engineered to spread the light emitted by the emitter array over a wide angle (e.g., 180 degrees). In each of the lidar sensors 1010a and 1010b, the same emitter array, the same detector array and the same controller, etc. can be used thus simplifying the manufacture of multiple different lidar sensors tailored for different purposes. Any or all of lidar sensors 1010a-1010d can incorporate use of redundant memory for faulty memory cells as described herein

VIII. Additional Embodiments

In the above detailed description, numerous specific details are set forth to provide a thorough understanding of embodiments of the present disclosure. However, it will be understood by those skilled in the art that the present disclosure can be practiced without these specific details.

For example, while various embodiments set forth above described may use SPADs, other detectors can be employed in embodiments. As another example, some of the embodiments discussed above include a specific number of rows and/or columns of sensors or detectors within a sensor. It is to be understood that those embodiments are for illustrative purposes only and embodiments are not limited to any particular number of columns or rows of sensors or detectors within a sensor.

Additionally, in some instances, well-known methods, procedures, components, and circuits have not been described in detail so as not to obscure the present disclosure. It is intended that all embodiments disclosed herein can be implemented separately or combined in any way and/or combination. Aspects described with respect to one embodiment may be incorporated in different embodiments although not specifically described relative thereto. That is, all embodiments and/or features of any embodiments can be combined in any way and/or combination.

Although the present disclosure has been described with respect to specific embodiments, it will be appreciated that the present disclosure is intended to cover all modifications and equivalents within the scope of the following claims.

What is claimed:

1. A light ranging system comprising:
a light source configured to transmit pulse trains over a plurality of time intervals as part of an optical measurement, wherein each of the pulse trains includes one or more pulses from the light source and corresponds to a different time interval;
a photosensor comprising one or more photodetectors configured to detect photons of the pulse trains to generate a plurality of signals over the plurality of time intervals for each of the one or more photodetectors, wherein a signal from a photodetector indicates whether a photon was detected during a time bin of a time interval;
an accumulation circuit configured to receive, for each of a plurality of time bins in each of the plurality of time intervals, a set of signals from the one or more photodetectors and to aggregate a number of positive signals in the set of signals that indicate a detection of a photon, thereby generating a total signal count for the time bin for each time interval;
a memory block corresponding to the photosensor and configured to store the total signal count for each of the plurality of time bins, wherein the accumulation circuit updates the total signal counts for the plurality of time bins for each time interval, wherein the memory block is partitioned into a plurality of memory bins, each memory bin storing the total signal count for one of the plurality of time bins, and wherein the number of memory bins is larger than the number of time bins; and
an address generator configured to skip an address associated with a memory bin having a faulty memory cell.

2. The light ranging system of claim 1, wherein the one or more photodetectors are one or more single photon avalanche diodes (SPADs).

3. The light ranging system of claim 1, wherein the memory block is a static random-access memory (SRAM) block.

4. The light ranging system of claim 1, wherein the address generator skips the address associated with the memory bin having the faulty memory cell using a shift register.

5. The light ranging system of claim 4, wherein the shift register comprises a plurality of flip flops and a plurality of corresponding multiplexers, and wherein each flip flop is capable of being bypassed by its corresponding multiplexer.

6. The light ranging system of claim 1, wherein the address generator skips the address associated with the memory bin having the faulty memory cell using a counter.

7. The light ranging system of claim 6, wherein the address generator comprises:
the counter, wherein the counter is configured to generate a value starting from a programmable start position and increment by one in accordance with a clock signal until reaching a programmable stop position; and
a one-hot decoder configured to convert the value of the counter to an output address.

8. The light ranging system of claim 7, wherein the programmable start position corresponds to a succeeding address of the address associated with the memory bin having the faulty memory cell, and wherein the programmable stop position corresponds to a preceding address of the address associated with the memory bin having the faulty memory cell.

9. The light ranging system of claim 1, wherein the memory block comprises a plurality of parallel memory banks.

10. The light ranging system of claim 1, wherein the memory block comprises a single memory bank.

11. A method of operating a light ranging system comprising:
transmitting, by a light source, pulse trains over a plurality of time intervals as part of an optical measurement, wherein each of the pulse trains includes one or more pulses from the light source and corresponds to a different time interval;
detecting, by a photosensor comprising one or more photodetectors, photons of the pulse trains to generate a plurality of signals over the plurality of time intervals for each of the one or more photodetectors, wherein a signal from a photodetector indicates whether a photon was detected during a time bin of a time interval;
receiving, by an accumulation circuit, for each of a plurality of time bins in each of the plurality of time intervals, a set of signals from the one or more photodetectors and to aggregate a number of positive signals in the set of signals that indicate a detection of a photon, thereby generating a total signal count for the time bin for each time interval; and
storing, by a memory block corresponding to the photosensor, the total signal count for each of the plurality of time bins, wherein the accumulation circuit updates the total signal counts for the plurality of time bins for each time interval, wherein the memory block is partitioned into a plurality of memory bins, each memory bin storing the total signal count for one of the plurality of time bins, and wherein the number of memory bins is larger than the number of time bins, and wherein an address associated with a first memory bin having a faulty memory cell is skipped by an address generator.

12. The method of claim 11, further comprising:
identifying the faulty memory cell in the memory block; and
determining the address associated with the faulty memory cell.

13. The method of claim 12, wherein the identifying the faulty memory cell in the memory block is based on testing the memory block.

14. The method of claim 12, wherein the determining the address associated with the faulty memory cell comprises:

determining the first memory bin associated with the faulty memory cell; and determining the address associated with the faulty memory cell based on the first memory bin.

15. The method of claim 11, wherein the address associated with the first memory bin is skipped using a shift register in the address generator.

16. The method of claim 15, wherein the shift register comprises a plurality of flip flops and a plurality of corresponding multiplexers, and each flip flop is capable of being bypassed by its corresponding multiplexer.

17. The method of claim 11, wherein the address associated with the first memory bin is skipped by setting a multiplexer corresponding to the address associated with the faulty memory cell to bypass a corresponding flip flop in a shift register in the address generator.

18. The method of claim 11, wherein the address associated with the first memory bin is skipped using a counter in the address generator.

19. The method of claim 11, wherein the address associated with the first memory bin is skipped by:

setting a start position of a counter in the address generator, the start position corresponding to a succeeding address associated with the faulty memory cell; and setting a stop position of the counter in the address generator, the stop position corresponding to a preceding address of the address associated with the faulty memory cell.

20. The method of claim 19, wherein the succeeding address is an immediately succeeding address, and the preceding address is an immediately preceding address.

* * * * *